United States Patent
Johnson (10) Patent No.: US 6,894,551 B2
(45) Date of Patent: May 17, 2005

(54) MULTIPHASE CLOCK GENERATORS

(75) Inventor: Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/656,987

(22) Filed: Sep. 5, 2003

(65) Prior Publication Data

US 2005/0052210 A1 Mar. 10, 2005

(51) Int. Cl.[7] ............................................. H03H 11/16
(52) U.S. Cl. ....................... 327/258; 327/117; 327/257; 327/295
(58) Field of Search ......................... 327/113–115, 117, 327/231, 238, 261, 254–258, 269, 285, 293, 295; 377/47, 48

(56) References Cited

U.S. PATENT DOCUMENTS

| | | | | |
|---|---|---|---|---|
| 5,022,057 A | * | 6/1991 | Nishi et al. ................. 375/373 |
| 5,349,622 A | * | 9/1994 | Gorisse ........................ 377/52 |
| 5,389,826 A | * | 2/1995 | Sonobe ....................... 307/125 |
| 5,485,195 A | * | 1/1996 | Nacman ...................... 347/247 |
| 5,867,046 A | | 2/1999 | Sugasawa |
| 5,907,589 A | * | 5/1999 | Koifman et al. ............... 377/47 |
| 5,948,046 A | * | 9/1999 | Hagberg ...................... 708/103 |
| 6,191,718 B1 | * | 2/2001 | Matsumoto .................. 341/143 |
| 6,242,953 B1 | * | 6/2001 | Thomas ....................... 327/115 |
| 6,249,157 B1 | * | 6/2001 | Nakura et al. ............... 327/117 |
| 6,373,911 B1 | * | 4/2002 | Tajima et al. ................ 375/375 |
| 6,501,816 B1 | * | 12/2002 | Kouznetsov et al. .......... 377/48 |
| 6,545,518 B2 | | 4/2003 | Saeki |
| 6,566,918 B1 | * | 5/2003 | Nguyen ....................... 327/115 |
| 2002/0059536 A1 | | 5/2002 | Saeki |

* cited by examiner

Primary Examiner—Timothy P. Callahan
Assistant Examiner—Hai L. Nguyen
(74) Attorney, Agent, or Firm—Leffert Jay & Polglaze, P.A.

(57) ABSTRACT

Multiphase clock generators and methods are provided. A multiphase clock generator has a first clock divider for generating a first-phase clock signal from a first input clock signal. A first logic gate is connected to an output port of the first clock divider. A second clock divider is connected to an output port of the first logic gate. The second clock divider is for generating a second-phase clock signal from the first input clock signal. A second logic gate is connected to an output port of the second clock divider. A third clock divider is connected to an output port of the second logic gate. The third clock divider is for generating a third-phase clock signal from a second input clock signal.

39 Claims, 3 Drawing Sheets

MULTIPHASE CLOCK GENERATORS

TECHNICAL FIELD OF THE INVENTION

The present invention relates generally to clock generators and in particular the present invention relates to multiphase clock generators.

BACKGROUND OF THE INVENTION

Clock signals are used for timing or synchronizing operations within many electronic devices. For example, clock signals are used for timing or synchronizing read and write operations for memories, such as flash memories, dynamic random access memories (DRAMs), static random access memories (SRAMs), etc., of electronic devices, such as desktop or portable computers. For some applications, clock signals are used to control data latching for read and write applications. For one application, such as for double-data-rate DRAMs, it is advantageous to latch data, for example, every half-clock cycle. This typically involves using a first latch of a latch system to latch data when the clock signal goes from low to high, i.e., on a positive clock transition (or positive clock edge), and using a second latch of the latch system to latch data a half clock cycle later when the clock signal goes from high to low, i.e., on a negative clock transition (or negative clock edge).

Typically, latches that latch data on positive clock transitions are of a different type than latches that latch data on negative clock transitions. For example, latches that latch data on positive clock transitions are often p-channel devices, whereas latches that latch data on negative clock transitions are often n-channel devices. One problem with this is that different type latches can cause timing variations that can distort the data output of the latch system. Therefore, it is often advantageous to latch data on a single clock edge, either positive or negative. Four-phase clocks can used to generate positive or negative clock edges at half clock cycle intervals. Each clock phase is then used to control a latch of a latch system having common latch types.

One method of developing a four-phase clock is to use each phase of a two phase-clock to drive two clock dividers. The clock dividers are then started in sequence at half clock cycle intervals. This often involves aligning a first phase of the two-phase clock with a second phase of the two-phase clock so that the first and second phases are a half clock cycle out of phase. That is, so that the first clock phase transitions high when the second clock phase transitions low and vice versa. Then, a first divider is started from a reset state when the first phase of the two-phase clock transitions high to start the first phase of the four-phase clock. A half clock cycle later, a second divider is started from a reset state when the second phase of the two-phase clock transitions high to start the second phase of the four-phase clock. Another half clock cycle later, a third divider is started from a reset state when the first phase of the two-phase clock transitions high again to start the third phase of the four-phase clock. Another half-clock cycle later, a fourth divider is started from a reset state when the second phase of the two-phase clock transitions high again to start the fourth phase of the four-phase clock. However, for relatively high frequencies, the half cycle intervals do not provide enough time to start the dividers owing to logic delays and startup times for the dividers.

For the reasons stated above, and for other reasons stated below which will become apparent to those skilled in the art upon reading and understanding the present specification, there is a need in the art for alternatives for starting phases of multiphase clocks.

SUMMARY

The above-mentioned problems with clock generators and other problems are addressed by the present invention and will be understood by reading and studying the following specification.

Various embodiments of the present invention relate to multiphase clock generators and methods. The clock generators generate multiple clock phases from one or more input clock signals using clock dividers. Successive clock phases are started out of order to provide more time between starting the clock phases for starting the clock dividers. After all of the clock phases are started, the clock phases are aligned so that successive clock phases are evenly displaced.

For one embodiment, the invention provides a multiphase clock generator with a first clock divider for generating a first-phase clock signal from a first input clock signal. A first logic gate is connected to an output port of the first clock divider. A second clock divider is connected to an output port of the first logic gate. The second clock divider is for generating a second-phase clock signal from the first input clock signal. A second logic gate is connected to an output port of the second clock divider. A third clock divider is connected to an output port of the second logic gate. The third clock divider is for generating a third-phase clock signal from a second input clock signal.

For another embodiment, the invention provides a memory device having an array of memory cells and control circuitry for controlling access to the array of memory cells. The control circuitry has a multiphase clock generator. The multiphase clock generator has a first clock divider for generating a first-phase clock signal from a first input clock signal. An input port of the first clock divider is connected to a first inverter. A first logic gate is connected to an output port of the first clock divider. A second clock divider is connected to an output port of the first logic gate through a second inverter. The second clock divider is for generating a second-phase clock signal from the first input clock signal. A second logic gate is connected to an output port of the second clock divider. A third clock divider is connected to an output port of the second logic gate through a third inverter. The third clock divider is for generating a third-phase clock signal from a second input clock signal. A third logic gate is connected to an output port of the third clock divider. A fourth clock divider is connected to an output port of the third logic gate through a fourth inverter. The fourth clock divider is for generating a fourth-phase clock signal from the second input clock signal.

For another embodiment, the invention provides a method of operating a multiphase clock generator. The method includes starting a first-phase clock signal at a first clock edge of a first input clock signal. At least one clock cycle of the first input clock signal after starting the first-phase clock signal, the method includes starting a second-phase clock signal at a second clock edge of the first input clock signal. After starting the second-phase clock signal, the method includes starting a third-phase clock signal at a first clock edge of a second input clock signal so that a clock edge of the third-phase clock signal occurs a half a clock cycle of the first input clock signal after a clock edge of the first-phase clock signal and the half the clock cycle of the first input clock signal before a clock edge of the second-phase clock signal. The first and second input clock signals have the same frequency and are half the clock cycle of the first input clock signal out of phase. The clock edges of the first-, second- and third-phase clock signals are like clock edges. At least one clock cycle of the first input clock signal after starting the third-phase clock signal, the method includes starting a fourth-phase clock signal at a second clock edge of the second input clock signal so that a clock edge of the fourth-phase clock signal occurs the half the clock cycle of the first input clock signal after the clock edge of the second-phase clock signal, wherein the clock edges of the second- and fourth-phase clock signals are like clock edges.

Further embodiments of the invention include methods and apparatus of varying scope.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
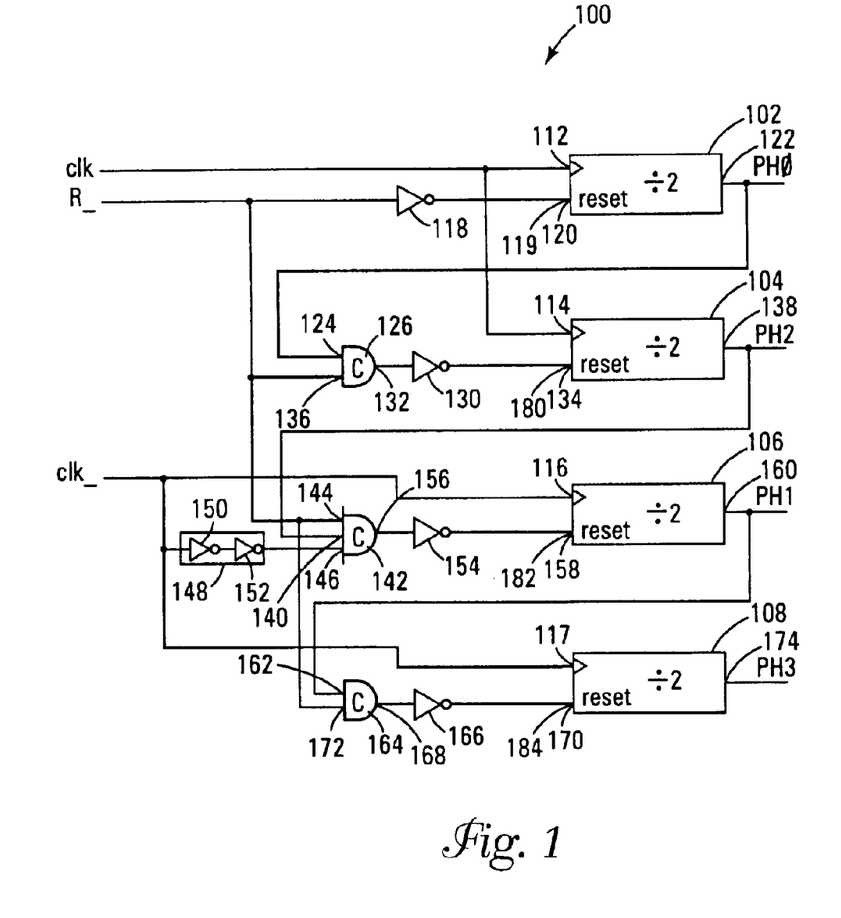
FIG. 1 illustrates a multiphase clock generator according to an embodiment of the present invention.

FIG. 1 illustrates a multiphase clock generator 100 according to an embodiment of the present invention. Clock generator 100 has clock dividers 102, 104, 106, and 108. For one embodiment, clock dividers 102 and 104 divide the frequency (or multiply the period) of an input clock signal CLK by a number, e.g., two, and clock dividers 106 and 108 divide the frequency (or multiply the period) of an input clock signal CLK_ by a number, e.g., two. CLK is received at input ports 112 and 114 respectively of clock dividers 102 and 104, while CLK_ is received at input ports 116 and 117 respectively of clock dividers 106 and 108.

Figure 2:
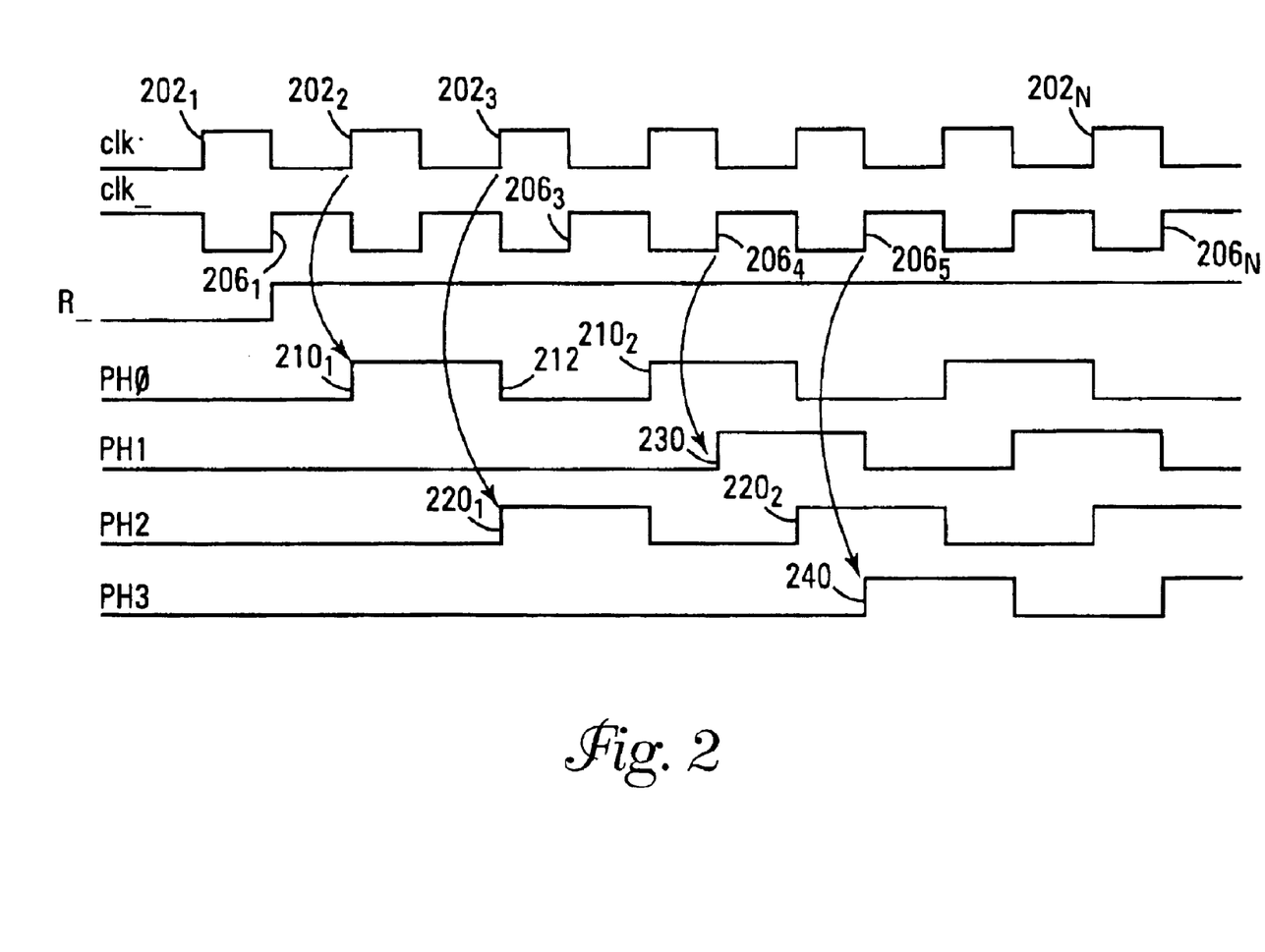
FIG. 2 illustrates timing of various clock phases according to another embodiment of the present invention.

For another embodiment, CLK and CLK_ are respective phases of a two-phase clock. CLK and CLK_ are illustrated in FIG. 2. For one embodiment, CLK and CLK_ are complimentary clock cycles having the same period and are aligned so that they are a half clock cycle (or clock period) out of phase, i.e., 180 degrees, as shown in FIG. 2. That is, positive clock edges 202 of CLK are shifted by a half-clock cycle from positive clock edges 206 of CLK_. This can be accomplished using a phase-locked loop (PLL), a delay-locked loop (DLL), etc. Positive clock edges 202 and 206 respectively correspond to CLK transitioning high (or going from low to high) and CLK_ transitioning high.

An inverter 118 is connected to an input port 120 of clock divider 102. Inverter 118 receives a reset signal R_, shown for one embodiment in FIG. 2, and transmits a reset signal 119 that is an inversion of reset signal R_ to input port 120. An output port 122 of clock divider 102 is connected to an input port 124 of a logic gate 126, such as a Muller C gate. An inverter 130 is connected between an output 132 of logic gate 126 and an input port 134 of clock divider 104. Logic gate 126 also has an input port 136 for receiving reset signal R_.

It will be appreciated by those skilled in the art that the output of a Muller C gate goes to logical one (or high) if all inputs are logical one. The output goes to logical zero (or low) if all inputs are logical zero. The output stays at the previous value if the inputs differ.

An output port 138 of clock divider 104 is connected to an input 140 of a logic gate 142, such as a modified (or asymmetric) Muller C gate. Logic gate 142 includes an input port 144 for receiving reset signal R_ and an input port 146 connected to a repeater (or buffer) 148 that for one embodiment, includes inverters 150 and 152. Repeater 148 receives CLK_ and sends CLK_ to input port 146 of logic gate 142 without changing the orientation of CLK_. For one embodiment, repeater 148 acts to decrease the load on CLK_. An inverter 154 is connected between an output port 156 of logic gate 142 and an input port 158 of clock divider 106.

It will be appreciated by those skilled in the art that the output of a modified Muller C gate goes to logic zero (or low) when first and second inputs are at logic zero, regardless of the logic value at a third input. The output goes to logic one (or high) when the second and third inputs are at logic one, regardless of the logic value at the first input. The output remains at the previous value for all other combinations of the logic values of the first, second, and third inputs.

An output port 160 of clock divider 106 is connected to an input port 162 of a logic gate 164, such as a Muller C gate. An inverter 166 is connected between an output 168 of logic gate 164 and an input port 170 of clock divider 108. Logic gate 164 also has an input port 172 for receiving reset signal R_. Clock divider 108 also has an output port 174. For another embodiment, output ports 122, 138, 160, 174 are connected to latches, such as read data latches, e.g., of a DRAM. For other embodiments, output ports 122, 138, 160, and 174 respectively output a phase-0 (PH0) clock signal, a phase-2 (PH2) clock signal, a phase-1 (PH1) clock signal, and a phase-3 (PH3) clock signal. The PH0, PH2, PH1, and PH3 clock signals are illustrated for one embodiment in FIG. 2.

For one embodiment, when logic gate 126 (or logic gate 164) receives two inputs having a common logic value, an output of logic gate 126 (or logic gate 164) assumes the common logic value. When logic gate 126 (or logic gate 164) receives two inputs having different logic values, the output of logic gate 126 (or logic gate 164) remains unchanged. For example, when both of the inputs of logic gate 126 (or logic gate 164) are logic ones (or logic highs), the output of logic gate 126 (or logic gate 164) is logic one (or logic high). When both of the inputs of logic gate 126 (or logic gate 164) are logic zeros (or logic lows), the output of logic gate 126 (or logic gate 164) is logic zero (or logic low). When the inputs of logic gate 126 (or logic gate 164) have different logic values, e.g., logic zero and logic one, the output of logic gate 126 (or logic gate 164) is the output from when both of the inputs previously had the same logic value. For example, when different logic input values follow two logic one inputs, the output stays at logic one, or when different logic input values follow two logic zero inputs, the output stays at logic zero.

For another embodiment, when the inputs to input ports 140 and 144 of logic gate 142 are both logic zeros (or logic low values), the output value at output port 156 is a logic zero (or a logic low value), regardless of whether the input to input port 146 is a logic one or zero (or a logic high or low value). When the inputs to input ports 140 and 146 are both logic ones (or logic high values), the output value at output port 156 is a logic one (or a logic high value), regardless of whether the input to input port 144 is a logic one or zero (or a logic high or low value). For all other combinations of input values to input ports 140, 144, and 146, the output value at output port 156 stays at the value from when the inputs to input ports 140 and 144 were last both logic zeros or when the inputs to input ports 140 and 146 were last both logic ones.

For one embodiment, reset signal R__ is initially low, as shown in FIG. 2, and clock dividers 102, 104, 106, and 108 are initially at a reset state. When clock dividers 102, 104, 106, and 108 are at the reset state, the PH0, PH2, PH1, and PH3 clock signals are low, e.g., at a logic zero, as shown in FIG. 2. For one embodiment, clock dividers 102, 104, 106, and 108 are in a reset state when reset signals 119, 180, 182, and 184 respectively at input ports 119, 134, 158, and 170 are high (or are turned on).

When reset signal R__ is low, reset signal 119 is high, causing signal divider 102 to be reset and thus the PH0 clock signal to be low. Consequently, the PH0 clock signal and reset signal R__ are respective low inputs of input ports 124 and 136 of logic gate 126, causing the output of logic gate 126 to be low. Inverter 130 inverts the output of logic gate 126 to produce reset signal 180, thus reset signal 180 is high, clock divider 104 is at the reset state, and the PH2 clock signal is low. Consequently, the PH2 clock signal and reset signal R__ are respective low inputs of input ports 144 and 140 of logic gate 142, causing the output of logic gate 142 to be low. Inverter 154 inverts the output of logic gate 142 to produce reset signal 182, thus reset signal 182 is high, clock divider 106 is at the reset state, and the PH1 clock signal is low. Consequently, the PH1 clock signal and reset signal R__ are respective low inputs of input ports 162 and 172 of logic gate 164, causing the output of logic gate 164 to be low. Inverter 166 inverts the output of logic gate 164 to produce reset signal 184, thus reset signal 184 is high, clock divider 108 is at the reset state, and the PH3 clock signal is low.

When R__ transitions high, as shown in FIG. 2, the reset signal 119 at input port 120 of clock divider 102 transitions low and is thus turned off, removing clock divider 102 from the reset state. When CLK transitions high, e.g., at a half a clock cycle of CLK after R__ transitions high, positive clock edge $202_2$ of CLK is produced at input port 112 of clock divider 102. The PH0 clock signal starts at positive clock edge $202_2$, e.g., by transitioning high to produce a positive clock edge $210_1$ of the PH0 clock signal, as shown in FIG. 2.

Consequently, the PH0 clock signal and reset signal R__ are respective high inputs of input ports 124 and 136 of logic gate 126, causing the output of logic gate 126 to be high and reset signal 180 to be low. Therefore, reset signal 180 is turned off and clock divider 104 is removed from the reset state. When positive clock edge $202_3$ occurs at input port 114 of clock divider 104, the PH2 clock signal starts at positive clock edge $202_3$, e.g., by transitioning high to produce a positive clock edge $220_1$ of the PH2 clock signal, as shown in FIG. 2.

For one embodiment, positive clock edge $220_1$ coincides with negative clock edge 212 of the PH0 clock signal, as shown in FIG. 2. That is, the PH0 clock signal transitions low when the PH2 clock signal transitions high and vice versa, and the PH0 and PH2 clock signals are one clock cycle of CLK out of phase. The one clock cycle of CLK between the start of the PH0 and PH2 clock signals compensates for logic delays and startup times of the clock dividers that can cause problems at relatively high frequencies for conventional clock generators that generate successive clock phases at half cycle intervals of CLK.

The PH2 clock signal and reset signal R are respective high inputs of input ports 144 and 140 of logic gate 142. When CLK__ transitions high to produce positive clock edge $206_3$ at input port 146 of logic gate 142 via repeater 148, the output of logic gate 142 goes high. Therefore, reset signal 182 is turned off and clock divider 106 is removed from the reset state. When positive clock edge $206_4$ occurs at input port 116 of clock divider 106, the PH1 clock signal starts at positive clock edge 2064, e.g., by transitioning high to produce a positive clock edge 230 of the PH1 clock signal, as shown in FIG. 2.

For one embodiment, positive clock edge 2064 occurs one-and-one-half clock cycles of CLK (or CKL__) after positive clock edge $202_3$. This compensates for logic delays and startup times of the clock dividers. Moreover, the occurrence of positive clock edge $206_4$ one-and-one-half clock cycles of CLK after positive clock edge $202_3$ means that positive clock edge 230 occurs one-and-one-half clock cycles of CLK after positive clock edge $220_1$ (the start) of the PH2 clock signal and thus one half clock cycle of CLK before a positive clock edge $220_2$ of the PH2 clock signal occurs, as shown in FIG. 2. Positive clock edge $206_4$ occurs two-and-one-half clock cycles of CLK (or CKL__) after positive clock edge $202_2$. This means that positive clock edge 230 occurs two-and-one-half clock cycles of CLK after positive clock edge $210_1$ (the start) of the PH0 clock signal and thus one half clock cycle of CLK after a positive clock edge $210_2$ of the PH0 clock signal occurs, as shown in FIG. 2.

The PH1 clock signal and reset signal R__ are respective high inputs of input ports 162 and 172 of logic gate 164, causing the output of logic gate 164 to be high and reset signal 184 to be low. Therefore, reset signal 184 is turned off and clock divider 108 is removed from the reset state. When positive clock edge $206_5$ of CLK__ occurs at input port 117 of clock divider 108, the PH3 clock signal starts at positive clock edge $206_5$, e.g., by transitioning high to produce a positive clock edge 240 of the PH3 clock signal, as shown in FIG. 2.

For one embodiment, positive clock edge $206_5$ occurs one clock cycle of CLK (or CKL__) after positive clock edge $206_4$. This compensates for logic delays and startup times of the clock dividers. Moreover, the occurrence of positive clock edge $206_5$ one clock cycle of CLK after positive clock edge $206_4$ means that positive clock edge 240 occurs one clock cycle of CLK after positive clock edge 230 (the start) of the PH1 clock signal and thus one half clock cycle of CLK after positive clock edge $220_2$ of the PH2 clock signal and one-and-one-half clock cycles of CLK after positive clock edge $210_2$ of the PH0, as shown in FIG. 2. Therefore, positive clock edges $210_2$, 230, $220_2$, and 240, respectively of the PH0, PH1, PH2 and PH3 clock signals, are respectively displaced by one half of a clock cycle of CLK (or CKL__). This represents the proper displacement between the positive clock edges of the PH0, PH1, PH2, and PH3 clock signals for one embodiment. Note that this is accomplished by starting the PH0, PH1, PH2, and PH3 clock signals out of order, i.e., PH0, followed by PH2, followed by PH1, followed by PH3. Starting the PH0, PH1, PH2, and PH3 clock signals out of order provides more time for starting the clock dividers.

Figure 3:
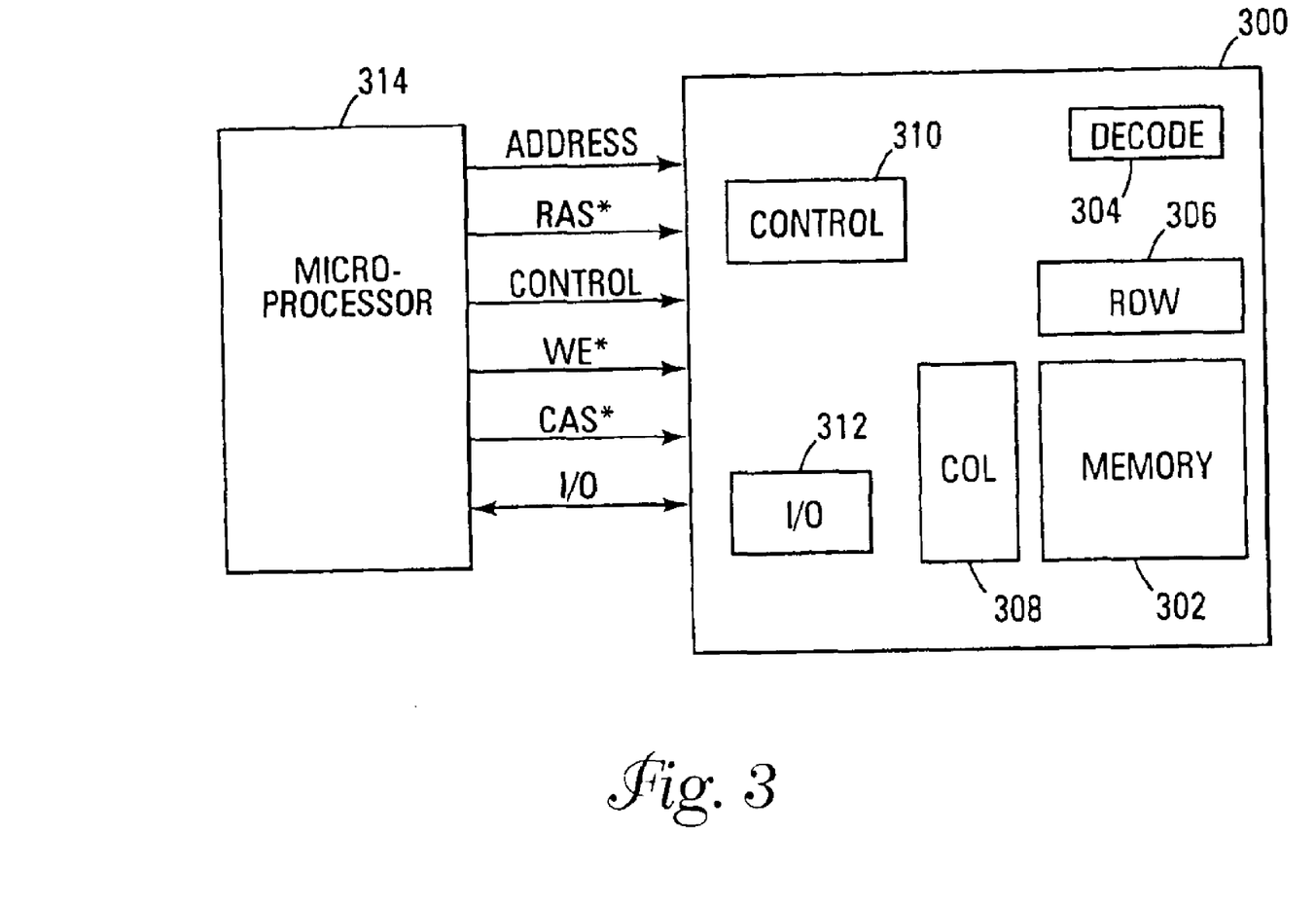
FIG. 3 is a block diagram of a memory system according to another embodiment of the present invention.

FIG. 3 is a simplified block diagram of an integrated circuit memory device 300 as a dynamic memory device, e.g., a DRAM (Dynamic Random Access Memory), in accordance with an embodiment of the invention. The memory device 300 includes an array of memory cells 302, an address decoder 304, row access circuitry 306, column access circuitry 308, control circuitry 310 for controlling access to the array of memory cells 302, and Input/Output (I/O) circuitry 312.

The memory device 300 can be coupled to an external microprocessor 314, or memory controller for memory accessing as part of an electronic system. The memory device 300 receives control signals from the processor 314, such as WE*, RAS* and CAS* signals. The memory cells are used to store data that are accessed via I/O lines. Control circuitry 310 decodes the control signals from processor 314 and controls access to the memory cells. These signals are used to control the operations of memory device 300, including data read and data write operations. The memory cells are accessed in response to the control signals and the address signals. For one embodiment, the control circuitry 310 includes circuitry for generating a multiphase clock, such as clock generator 100 of FIG. 1, in accordance with the invention. It will be appreciated by those skilled in the art that additional circuitry and control signals can be provided, and that the memory device of FIG. 3 has been simplified to help focus on the invention.

It will be understood that the above description of a DRAM is intended to provide a general understanding of the memory and is not a complete description of all the elements and features of a DRAM. Further, the invention is equally applicable to a variety of sizes and types of memory circuits known in the art, such as flash memory circuits, and is not intended to be limited to the DRAM described above.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A multiphase clock generator comprising:
   a first clock divider for generating a first-phase clock signal from a first input clock signal;
   a first logic gate connected to an output port of the first clock divider;
   a second clock divider connected to an output port of the first logic gate, the second clock divider for generating a second-phase clock signal from the first input clock signal;
   a second logic gate connected to an output port of the second clock divider; and
   a third clock divider connected to an output port of the second logic gate, the third clock divider for generating a third-phase clock signal from a second input clock signal.

2. The clock generator of claim 1, wherein the first clock generator and second clock generator each divide a frequency of the first input clock signal by two, and the third clock generator divides a frequency of the second input clock signal by two.

3. The clock generator of claim 1, further comprising:
   a first inverter connected between an input port of the first clock divider and the first input clock signal;
   a second inverter connected between an output port of the first logic gate and an input port of the second clock divider; and
   a third inverter connected between an output port of the second logic gate and an input port of the third clock divider.

4. The clock generator of claim 1, wherein a first input port of the second logic gate is for receiving a reset signal, a second input port of the second logic gate is connected to the output port of the second clock divider for receiving the second-phase clock signal therefrom, and a third input port of the second logic gate is for receiving the second input clock signal.

5. The clock generator of claim 4, further comprising a repeater connected between the third input port of the second logic gate and the second input clock signal.

6. The clock generator of claim 4, wherein:
   a logic value of an output of the second logic gate is low when logic values of the reset signal at the first input port and the second-phase clock signal at the second input port are both low, regardless of whether a logic value of the second input clock signal at the third input port is high or low;
   the logic value of the output of the second logic gate is high when the logic values of the second-phase clock signal at the second input port and the second input clock signal at the third input port are both high, regardless of whether the logic value of the reset signal at the first input port is low or high; and
   the logic value of the output of the second logic gate stays at the logic value of output of the second logic gate from when the logic values of the reset signal at the first input port and the second-phase clock signal at the second input port were last low or from when the logic values of the second-phase clock signal at the second input port and the second input clock signal at the third input port were last high for all other combinations of the logic values of the reset signal, the second-phase clock signal, and the second input clock signal respectively at the first, second, and third input ports.

7. The clock generator of claim 1, wherein the first logic gate comprises first and second input ports, the first input port is connected to the output port of the first clock divider for receiving the first-phase clock signal therefrom, and the second input port is for receiving a reset signal.

8. The clock generator of claim 7, wherein:
   a logic value of an output of the first logic gate is low when logic values of the first-phase clock signal at the first input port and the reset signal at the second input port are both low;
   the logic value of the output of the first logic gate is high when the logic values of the first-phase clock signal at the first input port and the reset signal at the second input port are both high; and
   when the logic value of the first-phase clock signal at the first input port and the reset signal at the second input port are different from each other, the logic value of the output of the first logic gate stays at the logic value of the output of the first logic gate from when the first-phase clock signal at the first input port and the reset signal at the second input port were last low or were last high.

9. The clock generator of claim 1, further comprising:
a third logic gate connected to an output port of the third clock divider; and
a fourth clock divider connected to an output port of the third logic gate, the fourth clock divider for generating a fourth-phase clock signal from the second input clock signal.

10. The clock generator of claim 9, further comprising an inverter connected between an output port of the third logic gate and an input port of the fourth clock divider.

11. A multiphase clock generator comprising:
a first clock divider for generating a first-phase clock signal from a first input clock signal, an input port of the first clock divider connected to a first inverter for receiving the first input clock signal;
a first logic gate connected to an output port of the first clock divider;
a second clock divider connected to an output port of the first logic gate through a second inverter, the second clock divider for generating a second-phase clock signal from the first input clock signal;
a second logic gate connected to an output port of the second clock divider;
a third clock divider connected to an output port of the second logic gate through a third inverter, the third clock divider for generating a third-phase clock signal from a second input clock signal;
a third logic gate connected to an output port of the third clock divider; and
a fourth clock divider connected to an output port of the third logic gate through a fourth inverter, the fourth clock divider for generating a fourth-phase clock signal from the second input clock signal.

12. The clock generator of claim 11, wherein the first and second clock generators divide a frequency of the first input clock signal by two, and the third and fourth clock generators divide a frequency of the second input clock signal by two.

13. The clock generator of claim 11, further comprising a repeater connected between an input port of the second logic gate the second input clock signal.

14. The clock generator of claim 11, wherein:
the first logic gate comprises first and second input ports, the first input port is connected to the output port of the first clock divider for receiving the first-phase clock signal therefrom, and the second input port is for receiving a reset signal;
the second logic gate comprises third, fourth, and fifth input ports, the third input port is for receiving the reset signal, the fourth input port is connected to the output port of the second clock divider for receiving the second-phase clock signal therefrom, and the fifth input port is for receiving the second input clock signal; and
the third logic gate comprises sixth and seventh input ports, the sixth input port is connected to the output port of the third clock divider for receiving the third-phase clock signal therefrom, and the seventh input port is for receiving the reset signal.

15. The clock generator of claim 11, wherein:
when the first or third logic gate receives two inputs having a common logic value, an output of the first or third logic gate is the common logic value; and
when the first or third logic gate receives two inputs having different logic values, the output of the first or third logic gate is the common logic value from the last time the first or third logic gate received two inputs having the common logic value.

16. The clock generator of claim 11, wherein:
an output of the second logic gate is a logic low value when first and second inputs of the second logic gate are logic low values, regardless of whether a third input of the second logic gate is a logic low or high value;
wherein the output of the second logic gate is a logic high value when the second and third inputs of the second logic gate are logic high values, regardless of whether the first input of the second logic gate is a logic low or high value; and
wherein the output of the second logic gate stays at the logic value from when the first and second inputs of the second logic gate were last at logic low values or from when the second and third inputs of the second logic gate were last at logic high values for all other combinations of the logic values of the first, second, and third inputs of the second logic gate.

17. A memory device comprising:
an array of memory cells; and
control circuitry for controlling access to the array of memory cells, the control circuitry comprising a multiphase clock generator, the multiphase clock generator comprising:
a first clock divider for generating a first-phase clock signal from a first input clock signal;
a first logic gate connected to an output port of the first clock divider;
a second clock divider connected to an output port of the first logic gate, the second clock divider for generating a second-phase clock signal from the first input clock signal;
a second logic gate connected to an output port of the second clock divider; and
a third clock divider connected to an output port of the second logic gate, the third clock divider for generating a third-phase clock signal from a second input clock signal.

18. The memory device of claim 17, wherein:
the first logic gate comprises first and second input ports, the first input port is connected to the output port of the first clock divider for receiving the first-phase clock signal therefrom, and the second input port is for receiving a reset signal; and
the second logic gate comprises third, fourth, and fifth input ports, the third input port is for receiving the reset signal, the fourth input port is connected to the output port of the second clock divider for receiving the second-phase clock signal therefrom, and the fifth input port is for receiving the second input clock signal.

19. The memory device of claim 17, wherein:
when the first logic gate receives two inputs having a common logic value, an output of the first logic gate is the common logic value; and
when the first logic gate receives two inputs having different logic values, the output of the first logic gate is the common logic value from the last time the first logic gate received two inputs having the common logic value.

20. The memory device of claim 17, wherein:
an output of the second logic gate is a logic low value when first and second inputs of the second logic gate are logic low values, regardless of whether a third input of the second logic gate is a logic low or high value;

the output of the second logic gate is a logic high value when the second and third inputs of the second logic gate are logic high values, regardless of whether the first input of the second logic gate is a logic low or high value; and the output of the second logic gate stays at the logic value from when the first and second inputs of the second logic gate were last at logic low values or from when the second and third inputs of the second logic gate were last at logic high values for all other combinations of the logic values of the first, second, and third inputs of the second logic gate.

21. A memory device comprising:

an array of memory cells; and control circuitry for controlling access to the array of memory cells, the control circuitry comprising a multiphase clock generator, the multiphase clock generator comprising:

a first clock divider for generating a first-phase clock signal from a first input clock signal, an input port of the first clock divider connected to a first inverter for receiving the first input clock signal;

a first logic gate connected to an output port of the first clock divider;

a second clock divider connected to an output port of the first logic gate through a second inverter, the second clock divider for generating a second-phase clock signal from the first input clock signal;

a second logic gate connected to an output port of the second clock divider;

a third clock divider connected to an output port of the second logic gate through a third inverter, the third clock divider for generating a third-phase clock signal from a second input clock signal;

a third logic gate connected to an output port of the third clock divider; and a fourth clock divider connected to an output port of the third logic gate through a fourth inverter, the fourth clock divider for generating a fourth-phase clock signal from the second input clock signal.

22. The memory device of claim 21, wherein:

the first logic gate comprises first and second input ports, the first input port is connected to the output port of the first clock divider for receiving the first-phase clock signal therefrom, and the second input port is for receiving a reset signal;

the second logic gate comprises third, fourth, and fifth input ports, the third input port is for receiving the reset signal, the fourth input port is connected to the output port of the second clock divider for receiving the second-phase clock signal therefrom, and the fifth input port is for receiving the second input clock signal; and the third logic gate comprises sixth and seventh input ports, the sixth input port is connected to the output port of the third clock divider for receiving the third-phase clock signal therefrom, and the seventh input port is for receiving the reset signal.

23. The memory device of claim 21, wherein:

when the first or third logic gate receives two inputs having a common logic value, an output of the first or third logic gate is the common logic value; and when the first or third logic gate receives two inputs having different logic values, the output of the first or third logic gate is the common logic value from the last time the first or third logic gate received two inputs having the common logic value.

24. The memory device of claim 21, wherein:

an output of the second logic gate is a logic low value when first and second inputs of the second logic gate are logic low values, regardless of whether a third input of the second logic gate is a logic low or high value;

the output of the second logic gate is a logic high value when the second and third inputs of the second logic gate are logic high values, regardless of whether the first input of the second logic gate is a logic low or high value; and the output of the second logic gate stays at the logic value from when the first and second inputs of the second logic gate were last at logic low values or from when the second and third inputs of the second logic gate were last at logic high values for all other combinations of the logic values of the first, second, and third inputs of the second logic gate.

25. A memory system comprising:

a processor; and a memory device coupled to the processor, the memory device comprising:

an array of memory cells; and control circuitry for controlling access to the array of memory cells, the control circuitry comprising a multiphase clock generator, the multiphase clock generator comprising:

a first clock divider for generating a first-phase clock signal from a first input clock signal;

a first logic gate connected to an output port of the first clock divider;

a second clock divider connected to an output port of the first logic gate, the second clock divider for generating a second-phase clock signal from the first input clock signal;

a second logic gate connected to an output port of the second clock divider; and a third clock divider connected to an output port of the second logic gate, the third clock divider for generating a third-phase clock signal from a second input clock signal.

26. The memory system of claim 25, wherein a first input port of the second logic gate is for receiving a reset signal, a second input port of the second logic gate is connected to the output port of the second clock divider for receiving the second-phase clock signal therefrom, and a third input port of the second logic gate is for receiving the second input clock signal.

27. The memory system of claim 26, wherein:

a logic value of an output of the second logic gate is low when logic values of the reset signal at the first input port and the second-phase clock signal at the second input port are both low, regardless of whether a logic value of the second input clock signal at the third input port is high or low;

the logic value of the output of the second logic gate is high when the logic values of the second-phase clock signal at the second input port and the second input clock signal at the third input port are both high, regardless of whether the logic value of the reset signal at the first input port is low or high; and the logic value of the output of the second logic gate stays at the logic value of output of the second logic gate from when the logic values of the reset signal at the first input port and the second-phase clock signal at the second input port were last low or from when the logic values of the second-phase clock signal at the second input port and the second input clock signal at the third input port were last high for all other combinations of the logic values of the reset signal, the second-phase clock signal, and the second input clock signal respectively at the first, second, and third input ports.

28. The memory system of claim 25, wherein the first logic gate comprises first and second input ports, the first input port is connected to the output port of the first clock divider for receiving the first-phase clock signal therefrom, and the second input port is for receiving a reset signal.

29. The memory system of claim 28, wherein:
a logic value of an output of the first logic gate is low when logic values of the first-phase clock signal at the first input port and the reset signal at the second input port are both low;
the logic value of the output of the first logic gate is high when the logic values of the first-phase clock signal at the first input port and the reset signal at the second input port are both high; and
when the logic value of the first-phase clock signal at the first input port and the reset signal at the second input port are different from each other, the logic value of the output of the first logic gate stays at the logic value of the output of the first logic gate from when the first-phase clock signal at the first input port and the reset signal at the second input port were last low or were last high.

30. A memory system comprising:
a processor; and
a memory device coupled to the processor, the memory device comprising:
an array of memory cells; and
control circuitry for controlling access to the array of memory cells, the control circuitry comprising a multiphase clock generator, the multiphase clock generator comprising:
a first clock divider for generating a first-phase clock signal from a first input clock signal, an input port of the first clock divider connected to a first inverter for receiving the first input clock signal;
a first logic gate connected to an output port of the first clock divider;
a second clock divider connected to an output port of the first logic gate through a second inverter, the second clock divider for generating a second-phase clock signal from the first input clock signal;
a second logic gate connected to an output port of the second clock divider;
a third clock divider connected to an output port of the second logic gate through a third inverter, the third clock divider for generating a third-phase clock signal from a second input clock signal;
a third logic gate connected to an output port of the third clock divider; and
a fourth clock divider connected to an output port of the third logic gate through a fourth inverter, the fourth clock divider for generating a fourth-phase clock signal from the second input clock signal.

31. The memory system of claim 30, wherein:
the first logic gate comprises first and second input ports, the first input port is connected to the output port of the first clock divider for receiving the first-phase clock signal therefrom, and the second input port is for receiving a reset signal;
the second logic gate comprises third, fourth, and fifth input ports, the third input port is for receiving the reset signal, the fourth input port is connected to the output port of the second clock divider for receiving the second-phase clock signal therefrom, and the fifth input port is for receiving the second input clock signal; and
the third logic gate comprises sixth and seventh input ports, the sixth input port is connected to the output port of the third clock divider for receiving the third-phase clock signal therefrom, and the seventh input port is for receiving the reset signal.

32. The memory system of claim 30, wherein:
when the first or third logic gate receives two inputs having a common logic value, an output of the first or third logic gate is the common logic value; and
when the first or third logic gate receives two inputs having different logic values, the output of the first or third logic gate is the common logic value from the last time the first or third logic gate received two inputs having the common logic value.

33. The memory system of claim 30, wherein:
an output of the second logic gate is a logic low value when first and second inputs of the second logic gate are logic low values, regardless of whether a third input of the second logic gate is a logic low or high value;
the output of the second logic gate is a logic high value when the second and third inputs of the second logic gate are logic high values, regardless of whether the first input of the second logic gate is a logic low or high value; and
the output of the second logic gate stays at the logic value from when the first and second inputs of the second logic gate were last at logic low values or from when the second and third inputs of the second logic gate were last at logic high values for all other combinations of the logic values of the first, second, and third inputs of the second logic gate.

34. A method of operating a multiphase clock generator, the method comprising:
starting a first-phase clock signal at a first clock edge of a first input clock signal;
at least one clock cycle of the first input clock signal after starting the first-phase clock signal, starting a second-phase clock signal at a second clock edge of the first input clock signal;
after starting the second-phase clock signal, starting a third-phase clock signal at a first clock edge of a second input clock signal so that a clock edge of the third-phase clock signal occurs a half a clock cycle of the first input clock signal after a clock edge of the first-phase clock signal and the half the clock cycle of the first input clock signal before a clock edge of the second-phase clock signal, wherein the first and second input clock signals have the same frequency and are half the clock cycle of the first input clock signal out of phase, wherein the clock edges of the first- second-, and third-phase clock signals are like clock edges; and
at least one clock cycle of the first input clock signal after starting the third-phase clock signal, starting a fourth-phase clock signal at a second clock edge of the second input clock signal so that a clock edge of the fourth-phase clock signal occurs the half the clock cycle of the first input clock signal after the clock edge of the second-phase clock signal, wherein the clock edges of the second- and fourth-phase clock signals are like clock edges.

35. The method of claim 34, further comprising removing a first clock divider from a reset state before starting the first-phase clock signal.

36. The method of claim 34, further comprising removing a second clock divider from a reset state before starting the second-phase clock signal.

37. The method of claim 34, further comprising removing a third clock divider from a reset slate before starting the third-phase clock signal.

38. The method of claim 34, further comprising removing a fourth clock divider from a reset state before starting the fourth-phase clock signal.

39. A method of operating a multiphase clock generator, the method comprising:

inverting a first logic-high reset signal at a first inverter of the clock generator to produce a first logic-low reset signal;

receiving the first logic-low reset signal at a first clock divider of the clock generator from the first inverter;

after receiving the first logic-low reset signal at the first clock divider, starting a first-phase clock signal at the first clock divider at a first clock edge of a first input clock signal received at the first clock divider;

receiving the first logic-high reset signal at a first logic gate of the clock generator;

receiving the first-phase clock signal at the first logic gate from the first clock divider;

sending a second logic-high reset signal from the first logic gate to a second inverter of the clock generator when the first-phase clock signal is a logic high;

inverting the second logic-high reset signal at the second inverter to produce a second logic-low reset signal;

receiving the second logic-low reset signal at a second clock divider of the clock generator from the second inverter;

after receiving the second logic-low reset signal at the second clock divider and at least one clock cycle of the first input clock signal after starting the first-phase clock signal, starting a second-phase clock signal at the second clock divider at a second clock edge of the first input clock signal received at the second clock divider;

receiving the first logic-high reset signal at a second logic gate of the clock generator;

receiving the second-phase clock signal at the second logic gate from the second clock divider;

receiving a second input clock signal at the second logic gate;

sending a third logic-high reset signal from the second logic gate to a third inverter of the clock generator when the second-phase clock signal and the second input clock signal are both logic highs;

inverting the third logic-high reset signal at the third inverter to produce a third logic-low reset signal;

receiving the third logic-low reset signal at a third clock divider of the clock generator from the third inverter;

after receiving the third logic-low reset signal at the third clock divider and after starting the second-phase clock signal, starting a third-phase clock signal at the third clock divider at a first clock edge of the second input clock signal received at the third clock divider so that a clock edge of the third-phase clock signal occurs a half a clock cycle of the first input clock signal after a clock edge of the first-phase clock signal and the half the clock cycle of the first input clock signal before a clock edge of the second-phase clock signal, wherein the first and second input clock signals have the same frequency and are half the clock cycle of the first input clock signal out of phase, wherein the clock edges of the first-, second-, and third-phase clock signals are like clock edges;

receiving the first logic-high reset signal at a third logic gate of the clock generator;

receiving the third-phase clock signal at the third logic gate from the third clock divider;

sending a fourth logic-high reset signal from the third logic gate to a fourth inverter of the clock generator when the third-phase clock signal is a logic high;

inverting the fourth logic-high reset signal at the fourth inverter to produce a fourth logic-low reset signal;

receiving the fourth logic-low reset signal at a fourth clock divider of the clock generator from the fourth inverter; and after receiving the fourth logic-low reset signal at the fourth clock divider and at least one clock cycle of the first input clock signal after starting the third-phase clock signal, starting a fourth-phase clock signal at the fourth clock divider at a second clock edge of the second input clock signal received at the fourth clock divider so that a clock edge of the fourth-phase clock signal occurs the half the clock cycle of the first input clock signal after the clock edge of the second-phase clock signal, wherein the clock edges of the second- and fourth-phase clock signals are like clock edges.

* * * * *